United States Patent
Kling et al.

(10) Patent No.: US 8,044,847 B1
(45) Date of Patent: Oct. 25, 2011

(54) ENHANCING RECEPTION OF SIGNALS IN GLOBAL POSITIONING SYSTEM (GPS) RECEIVER MODULE

(75) Inventors: Ralph M. Kling, Sunnyvale, CA (US); Darren S. Liccardo, San Jose, CA (US); Michael J. Grimmer, San Jose, CA (US)

(73) Assignee: Crossbow Technology, Inc., Milpitas, CA (US)

( * ) Notice: Subject to any disclaimer, the term of this patent is extended or adjusted under 35 U.S.C. 154(b) by 0 days.

(21) Appl. No.: 12/780,805

(22) Filed: May 14, 2010

Related U.S. Application Data

(62) Division of application No. 12/013,860, filed on Jan. 14, 2008.

(51) Int. Cl.
*G01S 19/48* (2010.01)
(52) U.S. Cl. .......................... 342/357.31; 342/357.34
(58) Field of Classification Search ... 342/357.2–357.78
See application file for complete search history.

(56) References Cited

U.S. PATENT DOCUMENTS

| | | | |
|---|---|---|---|
| 5,347,286 A | 9/1994 | Babitch | |
| 5,351,060 A | 9/1994 | Bayne | |
| 6,882,312 B1 | 4/2005 | Vorobiev et al. | |
| 7,136,751 B2 | 11/2006 | Pinto et al. | |
| 7,477,192 B1 | 1/2009 | Haff et al. | |
| 7,786,933 B2 | 8/2010 | Chang | |
| 2002/0008662 A1* | 1/2002 | Dooley et al. | 342/458 |
| 2002/0173909 A1* | 11/2002 | Verbil | 701/213 |
| 2003/0107517 A1 | 6/2003 | Ikeda et al. | |

OTHER PUBLICATIONS

United States Office Action, U.S. Appl. No. 12/780,794, Mar. 3, 2011, 7 pages.
United States Office Action, U.S. Appl. No. 12/780,798, Mar. 1, 2011, 6 pages.
United States Office Action, U.S. Appl. No. 12/780,797, Nov. 24, 2010, 6 pages.

* cited by examiner

*Primary Examiner* — Thomas Tarcza
*Assistant Examiner* — Nga X Nguyen
(74) *Attorney, Agent, or Firm* — Fenwick & West LLP

(57) ABSTRACT

An antenna assembly for receiving the GPS signals in a global positioning system (GPS) receiver module automatically orients the antenna to better receive the GPS signals. The antenna is oriented by a positioner (e.g., a counterweight) that automatically rotates a frame on which the antenna is mounted. The GPS receiver module may also include multiple antennas oriented in different directions to maintain good reception of the GPS signals in any position. The multiple antennas are oriented in a manner so that the poor reception range an antenna is covered by other antennas. Signals from multiple antennas may be combined or chosen for processing by a GPS processor. Also, multiple GPS receiver modules may be deployed in close proximity so that wireless communication between the GPS receiver modules may be established.

8 Claims, 12 Drawing Sheets

ENHANCING RECEPTION OF SIGNALS IN GLOBAL POSITIONING SYSTEM (GPS) RECEIVER MODULE

CROSS-REFERENCE TO RELATED APPLICATION

This application is a divisional application of and claims priority under 35 U.S.C. §121 to co-pending U.S. patent application Ser. No. 12/013,860 entitled "Enhanced Reception of Signals in Global Positioning System (GPS) Receiver Module," filed on Jan. 14, 2008, which is incorporated by reference herein in its entirety.

BACKGROUND OF THE INVENTION

1. Field of the Invention

This invention relates to enhancing the performance of a Global Positioning System (GPS) receiver module, and more particularly to enhancing reception of the GPS signals or using other information to determine the location of a GPS receiver module.

2. Background of the Invention

Global Positioning System (GPS) is a multiple-satellite based radio positioning system in which each GPS satellite transmits signals that allow locations to be determined by measuring the distance from selected GPS satellites. The satellites are positioned in a constellation such that typically seven, but a minimum of four satellites will be observable by a user anywhere on or near the earth's surface. Therefore, the GPS satellites provide GPS signals that may be received globally on a continuous basis. The GPS signals are carried over two frequencies known as L1 (1575.42 MHz) and L2 (1227.6 MHz) using spread spectrum techniques that employ spreading functions.

GPS is intended to be used in a wide variety of civilian and military applications such as vehicle navigation, precise positioning, time transfer, attitude reference, and surveying. FIG. 1 is a diagram illustrates an application of tracking parcels 122 transported via a vehicle 120. GPS receiver modules are contained or secured to the parcels 122 to determine and track the location of the parcels 122 based on the GPS signals from a constellation of satellites 110.

A GPS receiver module comprises a number of components including, among other components, an antenna assembly, an RF assembly, and a GPS processor. The antenna assembly receives the L-band GPS signal and feeds it to the RF assembly. The RF assembly mixes the L-band GPS signal down to a signal of intermediate frequency (IF). Using various known techniques, the PRN code modulating the L-band signal is tracked through code-correlation to measure the time of transmission of the signals from the satellite. The GPS processor differences the measured time of transmission with the time of reception and determines a pseudo range between the receiver and the satellite. This pseudo range includes both the range to the satellite and the offset of the receiver's clock from the GPS master time reference. The GPS processor computes a three dimensional position based on the pseudo range measurements and navigation data from multiple satellites.

Reception of the GPS signals at the GPS receiver module is vital to determining accurate location of the GPS receiver. For various reasons, however, the quality of GPS signals received at the GPS receiver module may be degraded. One of the causes of poor reception is the non-optimal orientation of the antenna. If the GPS antenna is not oriented toward the satellites, the reception of the GPS signals may be poor. FIG. 2 illustrates a graph illustrating an antenna pattern of a conventional GPS antenna. The GPS antenna of FIG. 2 has good signal reception up to approximately 100 degrees from the pattern maximum (at 0 degree) but degrades significantly above approximately 100 degrees and reaches the pattern minimum at 180 degrees from the pattern maximum. In this range between approximately 100 degrees and 180 degrees, the signal reception is degraded significantly. If the GPS signals are received in this poor reception range, the reception of the GPS signals degrades significantly. Although the reception may be improved by manually reorienting the GPS antennas so that the poor reception range does not face the satellites, the manual adjustment of the GPS antennas may not be practicable or possible in some applications.

SUMMARY OF THE INVENTION

In one embodiment, reception of global positioning system (GPS) signals is enhanced by automatically adjusting the orientation of an antenna of a GPS receiver module. Specifically, an antenna assembly of the GPS receiver module may include a directional antenna secured to a rotating frame. The antenna is mounted on a rotatable frame that rotates automatically so that the poor reception range of the antenna does not face toward the source of the GPS signal (e.g., toward the sky). The frame may be rotated by a positioner (e.g., a counterweight) secured to the frame. By automatically adjusting the orientation of the antenna, good reception of the GPS antenna is maintained regardless of the position or orientation of the GPS receiver module.

In one embodiment, reception of the GPS signals is enhanced by using multiple antennas oriented in different directions. At least one antenna of the two or more antennas has good reception of the GPS signals. The GPS signals from the antenna with good reception can be tuned, decoded and processed. One antenna complements the poor reception range of other antennas, and thus, at least one antenna provides the GPS signals of good quality. The GPS signals from the multiple antennas may be combined to generate enhanced GPS signals. Alternatively, an antenna of a preferred orientation may be selected to provide the GPS signals for processing.

In one embodiment, the orientation of the antennas may be tracked to select an antenna from multiple antennas to receive the GPS signals. An accelerometer detects the direction of earth's gravity and controls a switch that selectively couples a location processor and the antennas. Specifically, the switch may couple the location processor to an antenna that is oriented toward the source of the GPS signals. By receiving the GPS signals via multiple antennas and selecting an antenna that has better reception, the GPS receiver module can more accurately determine its location.

In one embodiment, the acceleration signal from the accelerometer is low-pass filtered to avoid frequent switching of the antenna. High frequency components of the acceleration signals may be caused by noises, vibrations or transient motions to the GPS antenna assembly which may not reflect the true orientation of the GPS receiver module. The low-passed filtered acceleration signals have suppressed or reduced high frequency components compared to unfiltered acceleration signals, and thus, are more reflective of the actual orientation of the antennas.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the disclosed subject matter.

BRIEF DESCRIPTION OF THE DRAWINGS

Embodiments disclosed can be readily understood by considering the following detailed description in conjunction with the accompanying drawings.

DETAILED DESCRIPTION OF THE INVENTION

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable, similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

GPS Receiving Module Having Antenna Assembly with Rotating Antenna Frame

In one embodiment, reception of global positioning system (GPS) signals is enhanced by automatically adjusting the orientation of an antenna of a GPS receiver module. Specifically, an antenna assembly includes a directional antenna secured to a frame rotating automatically so that the poor reception range of the antenna does not face toward the source of the GPS signal. The poor reception range is the field of reception at the antenna where the signal reception is degraded significantly. By automatically adjusting the orientation of the antenna, good reception of the GPS antenna is maintained regardless of the position and/or orientation of the GPS receiver module.

Figure 3:
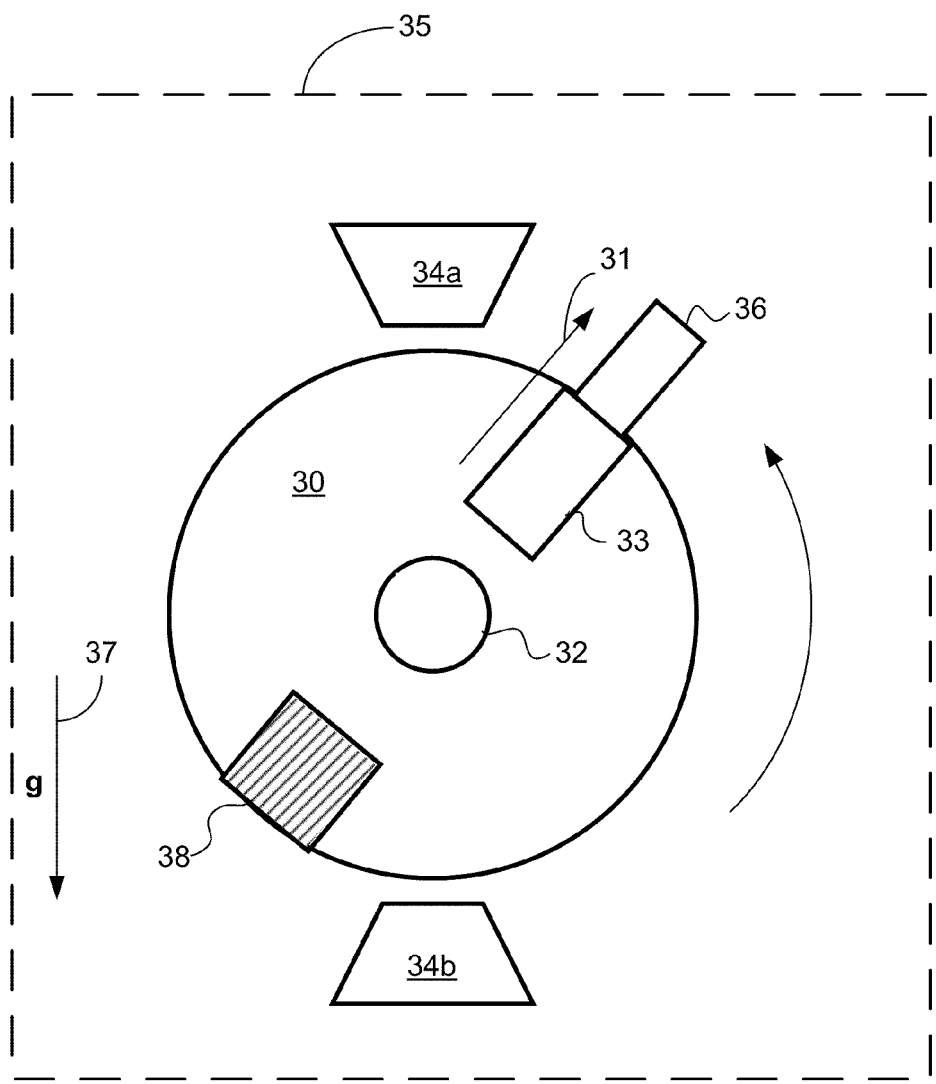
FIG. 3 is a diagram illustrating a GPS receiver module having an antenna assembly with a rotatable frame, according to one embodiment.
Figure 4A:
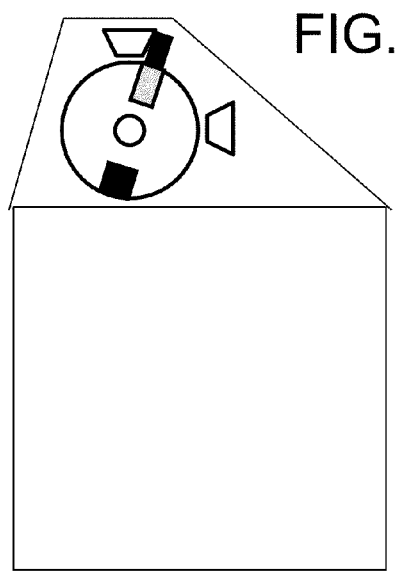
FIGS. 4A to 4D are diagrams illustrating the GPS receiver module of FIG. 3 placed in different orientations, according to one embodiment.
Figure 4B:
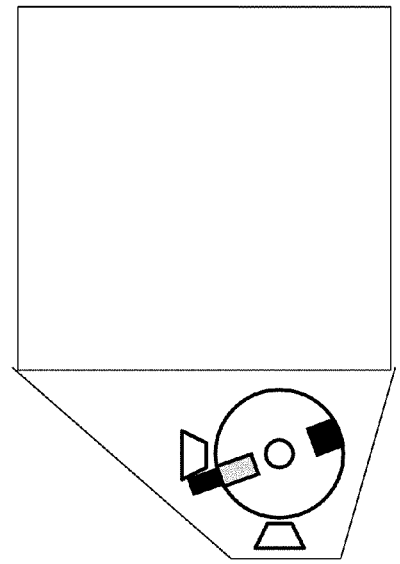
Figure 4C:
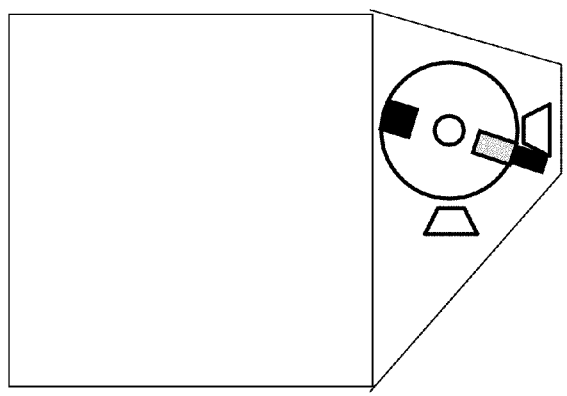
Figure 4D:
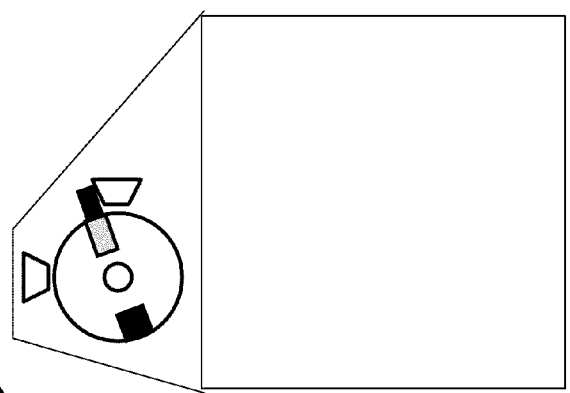

FIG. 3 is a GPS receiver module 35 including an antenna assembly, according to one embodiment. The antenna assembly of FIG. 3 includes, among other components, a rotatable frame 30, a pivot 32 rotatably securing the rotatable frame 30, a directional GPS antenna 33, an arm 36, two restrictors 34a, 34b, and a counterweight 38. The directional antenna 33 and the counterweight 38 are secured to the frame 30. The counterweight 38 weighs more than the combination of the arm 36 and the antenna 33. In one embodiment, the frame is cylindrical in shape.

Figure 1:
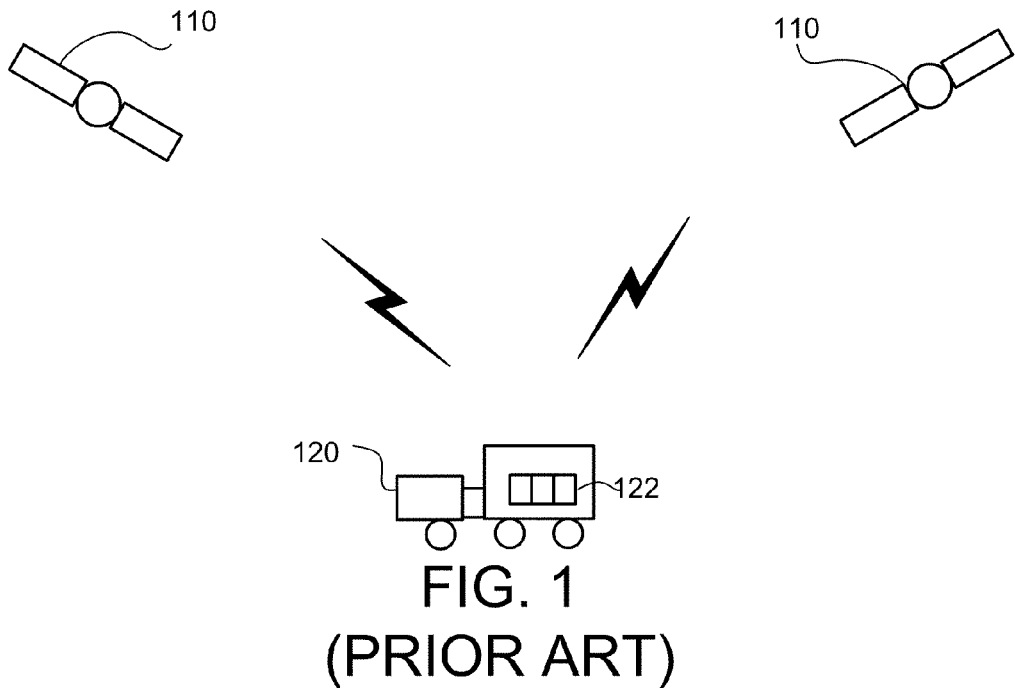
FIG. 1 is a diagram illustrating parcels tracked using global positioning system (GPS).
Figure 2:
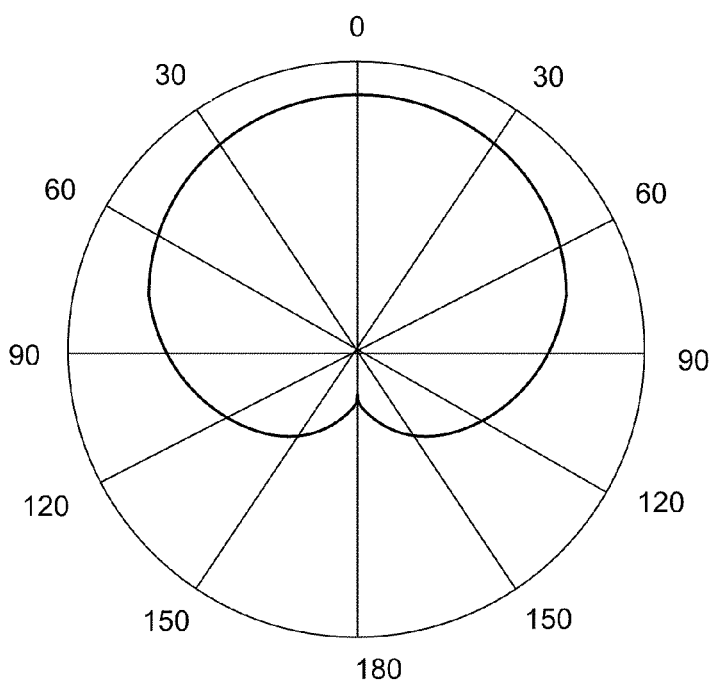
FIG. 2 is a graph illustrating an antenna pattern of a GPS antenna.

The counterweight 38 functions as the positioner that rotates the frame 30 when the antenna assembly is placed in a vertically upright manner. The gravity (as indicated by an arrow 37) acts on the counterweight 38 and forces the frame to rotate (e.g., counterclockwise in FIG. 3) so that the pattern maximum of the directional antenna 33 orients toward the source of the GPS signals (i.e., satellites). The pattern maximum of the directional antenna 33 is in the direction as illustrated by an arrow 31, while the pattern minimum is in the opposite direction. The pattern maximum is a point in the antenna pattern where the signal reception is the best, and the pattern minimum is a point in the pattern antenna where the signal reception is the worst. The signal reception in the range around the pattern minimum is poor, and thus, the signal reception is degraded significantly if the GPS signals are received in this poor reception range. In the example of FIG. 2, the poor reception range of the antenna is the range between approximately 100 degree and 180 degrees from the pattern maximum at 0 degree. By rotating the frame 30 so that the pattern maximum point of the directional antenna 33 heads upwards, the directional antenna 33 is automatically oriented to have good reception of the GPS signals.

When the frame 30 is placed in a horizontal manner (i.e., the axis of the pivot 32 generally parallel to the arrow 37), the gravity does not act on the counterweight to rotate the frame 30. Referring to FIG. 2, however, the quality of reception of the GPS signals is generally good or fair up to an angle of approximately 100 degrees from the pattern maximum (0 degree). Therefore, as long as the poor reception range does not face upwards to the satellites 110, the reception of the GPS signals at the antenna 33 is acceptable without any rotation of the frame 30.

The arm 36 in conjunction with the restrictors 34a, 34b functions to limit the rotation of the frame 30. By limiting the rotation of the frame 30, the pendulum motion of the frame 30 is prevented. The pendulum motion of the frame makes the reception of the GPS signals at the directional antenna 33 unstable, and should be avoided. In one embodiment, the restrictors 34a, 34b and the arm 36 are removed to allow further rotation of the frame 30. A damper may be provided to reduce the pendulum motion of the frame 30.

FIGS. 4A to 4D illustrate the orientation of the antenna 33 in various orientations of the GPS receiver module 35. As illustrated in FIGS. 4A to 4D, regardless of how the antenna assembly is oriented, the antenna 33 is oriented so that good reception of the GPS signals is maintained. By orienting the antenna 33 so that the poor reception range of the antenna 33 does not face the source of the GPS signals, the antenna 33 can maintain good reception for the GPS signals in any positions and orientations of the GPS receiver module 35.

GPS Receiver Module Having Multiple Antennas

In alternative embodiments, the GPS receiver module includes multiple antennas oriented in different directions to maintain good reception of the GPS signals. The multiple antennas are oriented in a manner so that the poor reception range of one antenna is complemented or supplanted by other antennas. GPS signals from multiple antennas may be combined to obtain enhanced GPS signals, or one or more preferred antennas with good signal reception may be selected to provide the GPS signals for processing.

Figure 5:
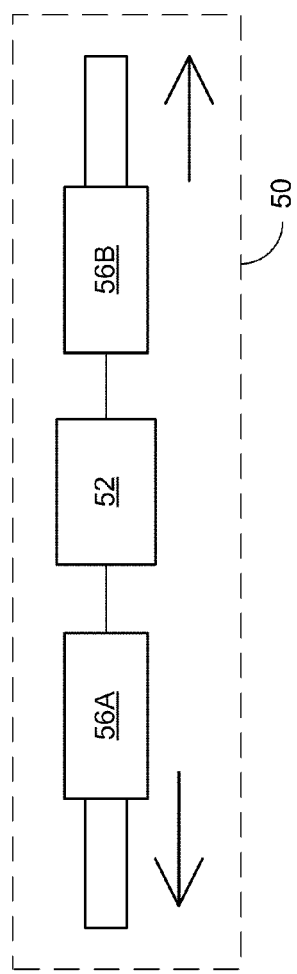
FIG. 5 is a diagram illustrating a GPS receiver module having two antennas oriented in opposite directions, according to one embodiment.

FIG. 5 is a diagram illustrating a GPS receiver module 50 including an antenna assembly with two antennas 56A, 56B oriented in opposite directions (180 degrees), according to one embodiment. The antenna 56A is oriented so that the poor reception range of the antenna 56B is covered by the antenna 56A, and vice versa. The GPS signals from both antennas 56A, 56B are fed to circuitry 52 for tuning, modulating, and processing of the GPS signals. The antennas need not be oriented in opposite directions; the two antennas may be oriented at any angle so long as the poor reception ranges of the two antennas do not overlap.

Figure 6:
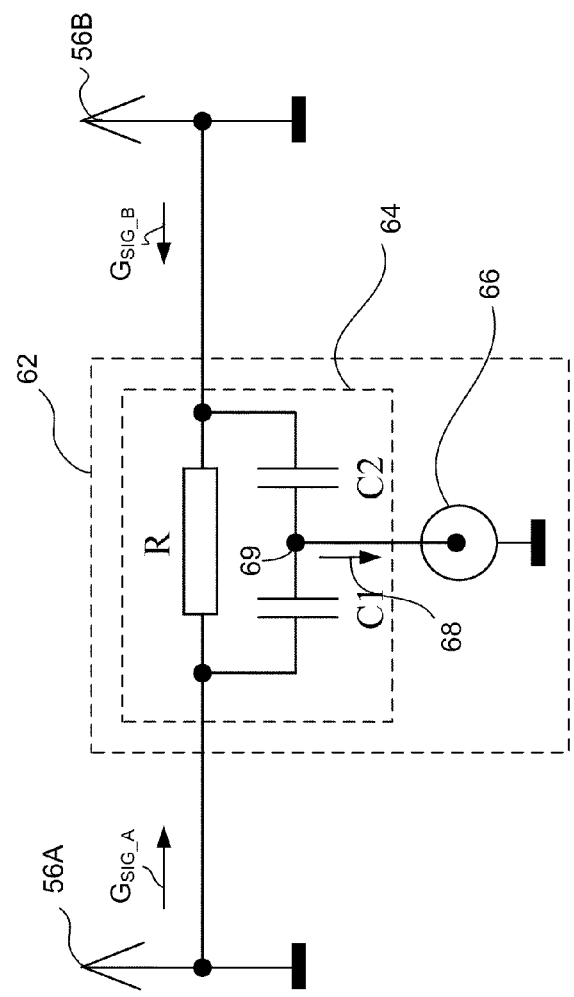
FIG. 6 is a block diagram of an antenna assembly combining GPS signals from two antennas, according to one embodiment.

FIG. 6 is a block diagram of an antenna assembly enhancing GPS signals by combining GPS signals from two antennas, according to one embodiment. The signal $G_{SIG\_A}$ received at the antenna 56A and the signal $G_{SIG\_B}$ are fed to circuitry 62. In one embodiment, the antenna 56A and the antenna 56B are oriented in the opposite direction. The circuitry 62 comprises a tuning circuit 64 and a combined output 66. The tuning circuit 64 includes a resistor-capacitor (RC) network 64 including, among other components, a resistor R and capacitors C1, C2. The capacitors C1 and C2 are coupled in series. The resistor R is coupled in parallel with the capacitors C1 and C2. The RC network 64 filters and combines the GPS signals $G_{SIG\_A}$ and $G_{SIG\_B}$.

The enhanced GPS signal 68 is obtained at node 69 between the capacitor C1 and the capacitor C2. The enhanced GPS signal 68 is then fed to a GPS receiver (not shown) connected to output 66. The GPS receiver (not shown) includes, among other components, a radio-frequency (RF) modulator and a GPS processor. The RF modulates the GPS signals into IF (Intermediate Frequency) signals to facilitate processing by the GPS processor. The GPS processor decodes and computes the location of the GPS receiver module based on the modulated GPS signals. The resistor and capacitor network illustrated in FIG. 6 is merely illustrative, and different combinations of resistors, capacitors or other electronic components may also be used.

The antenna assembly of FIG. 6 is advantageous in that it includes only passive electronic components; and thus, does not consume power to enhance the GPS signals. Further, the antenna assembly of FIG. 6 is simple and inexpensive to implement.

Figure 7:
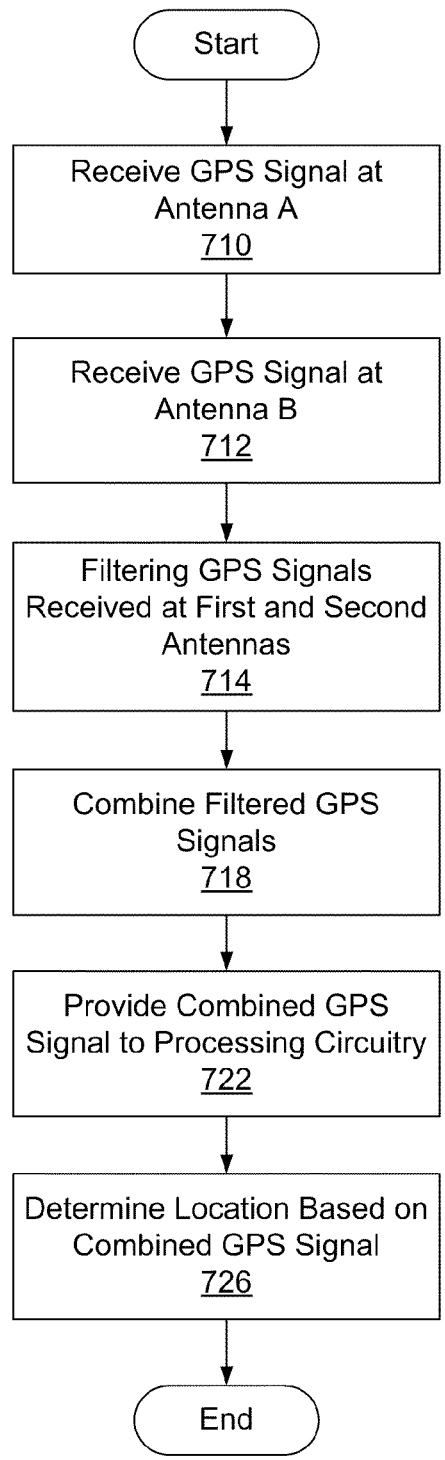
FIG. 7 is a flowchart illustrating a method of enhancing reception of the GPS signals by combining the GPS signals from two antennas, according to one embodiment.

FIG. 7 is a flowchart illustrating a method of enhancing the GPS signals by combining GPS signals received at two antennas 56A, 56B, according to one embodiment. First, the GPS signal $G_{SIG\_A}$ is received 710 at the antenna 56A. Likewise, the GPS signal $G_{SIG\_B}$ is received 712 at the antenna 56B. Then the GPS signals $G_{SIG\_A}$ and $G_{SIG\_B}$ are filtered 714 via the tuning circuit 64. The GPS signals $G_{SIG\_A}$ and $G_{SIG\_B}$ are then combined 718 at the tuning circuit 64, and provided 722 to the output 66. The output 66 feeds the enhanced GPS signal to the GPS receiver which modulates, decodes, and processes the enhanced GPS signals to determine 726 the location of the GPS receiver module.

Figure 8:
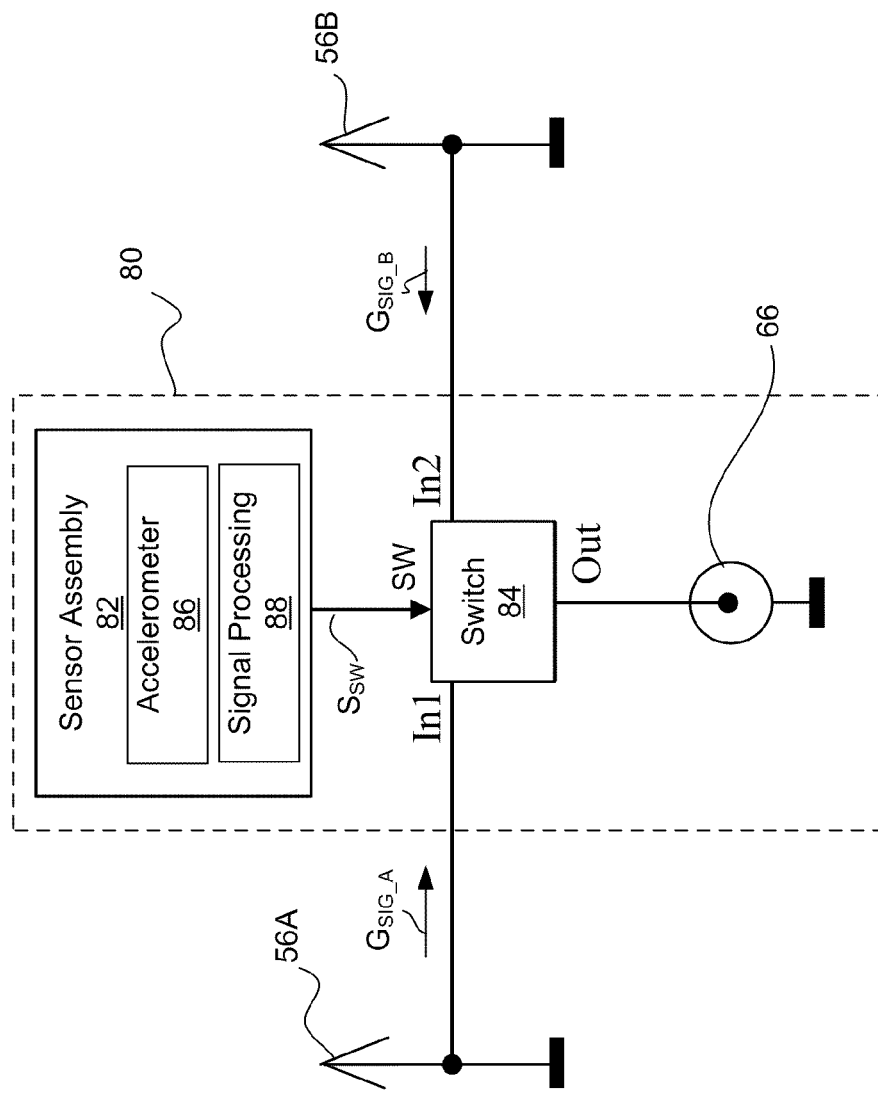
FIG. 8 is a block diagram of an antenna assembly switching between two antennas to receive the GPS signals, according to one embodiment.

FIG. 8 is a block diagram of an antenna assembly switching between two antennas 56A, 56B to receive the GPS signals, according to one embodiment. The antenna assembly of FIG. 8 includes, among other components, two antennas 56A, 56B and circuitry 80. As in the embodiment of FIG. 6, the GPS signals $G_{SIG\_A}$ from the antenna 56A, and the GPS signal $G_{SIG\_B}$ from the antenna 56B are fed to the circuitry 80. The circuitry 80 in the embodiment of FIG. 8 is different from the circuitry 62 of the embodiment of FIG. 6 in that the circuitry 80 selectively couples the antennas 56A, 56B to the combined output 66 using a switch 84. The circuitry 80 includes, among other components, a sensor assembly 82, the switch 84, and the output 66.

The sensor assembly 82 generates and sends a switching signal $S_{SW}$ to a switch signal node SW of the switch 84. The sensor assembly 82 includes, among other components, an accelerometer 86, and a signal processing module 88. The accelerometer 86 generates an acceleration signal indicating the orientation of the GPS receiver module by sensing the direction of the gravity relative to the orientation of the GPS receiver module. In one embodiment, a single-axis accelerometer is used for generating the acceleration signal indicative of the orientation of the accelerometer relative to Earth's gravity. In another embodiment, a three-axis accelerometer is used. For example, a single part digital MEMS accelerometers (part no.: STM EK3LV02DQ) from ST Microelectronics (Geneva, Switzerland) may be used to generate the acceleration signal. This accelerometer is merely illustrative, and various other accelerometer may also be used.

The signal processing module 88 processes the acceleration signal from the accelerometer to generate the switching signal $S_{SW}$, as described below in detail with reference to FIGS. 9A to 9D.

The switch 84 receives the signal $G_{SIG\_A}$ at a first input node In1, and the signal $G_{SIG\_B}$ at the second input node In2. The switch 84 selectively couples the input nodes In1 and In2 with an output node Out of the switch 84 in accordance with the switching signal $S_{SW}$. Therefore, depending on the switching signal $S_{SW}$, either the signal $G_{SIG\_A}$ or $G_{SIG\_B}$ (but not both) is provided to the GPS receiver (not shown) via the output 66 for tuning, modulation, decoding, and computation to determine the location of the GPS receiver module. By selecting one antenna and coupling the antenna with the output 66, the GPS receiver (not shown) receives GPS signals $G_{SIG\_A}$ or $G_{SIG\_B}$ having better quality. The GPS signals from one antenna are isolated from the GPS signals from the other antenna. Therefore, the GPS signals of high quality are not degraded or corrupted by the GPS signals of lower quality before being provided to the GPS receiver.

Figure 9A:
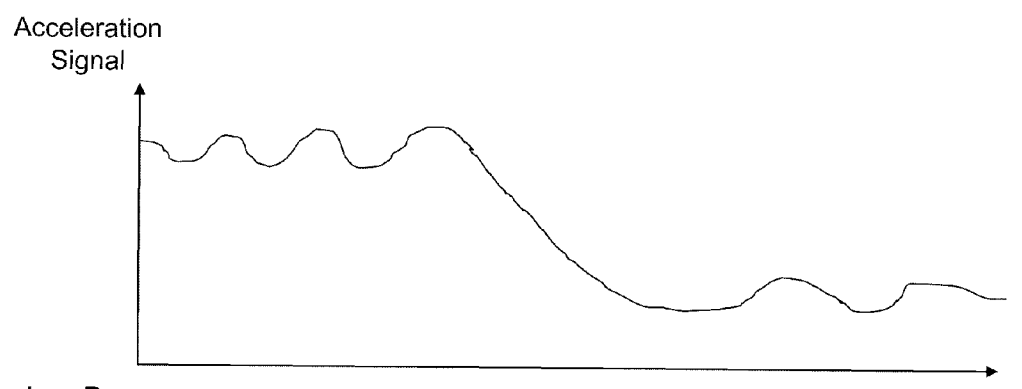
FIG. 9A is a graph illustrating an acceleration signal from an accelerometer for switching the antennas, according to one embodiment.

FIG. 9A is a graph illustrating an acceleration signal from the accelerometer 86, according to one embodiment. A high acceleration signal represents that the GPS receiver module is oriented in a direction so that the antenna 56A has better reception of the GPS signals than the antenna 56B. In contrast, a low acceleration signal represents that the GPS receiver module is oriented in a direction so that the antenna 56B has better reception of the GPS signals than the antenna 56A.

Figure 9B:
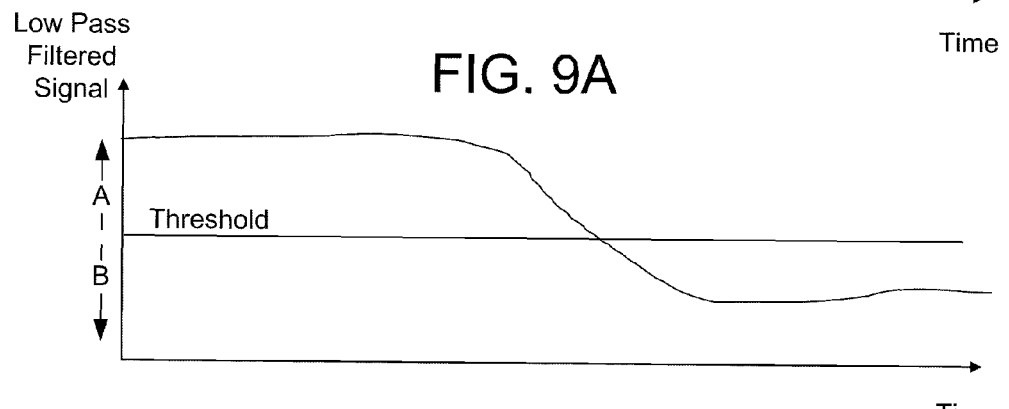
FIG. 9B is a graph illustrating a low-pass filtered version of the acceleration signal of FIG. 9A, according to one embodiment.

The acceleration signal from the accelerometer 86 fluctuates significantly over time because the accelerometer 86 senses and changes the acceleration signal according to transient dynamic motions of the GPS receiver module, noises and vibrations. Such short term dynamic motions, noises and vibrations may not represent the true orientation of the GPS receiver module, and may lead the accelerometer 86 to generate the acceleration signal not coinciding with the actual orientation of the GPS receiver module. Therefore, the acceleration signal from the accelerometer is low-pass filtered as illustrated in FIG. 9B. When the filtered acceleration signal is above a threshold, one antenna (e.g., the antenna 56A) is selected to provide the GPS signals (e.g., $G_{SIG\_A}$) to the GPS receiver (not shown) via the output 66. In contrast, when the filtered acceleration signal is not above the threshold, the other antenna (e.g., 56B) is selected to provide the GPS signals (e.g., $G_{SIG\_B}$) to the GPS receiver (not shown) via the output 66.

Figure 9C:
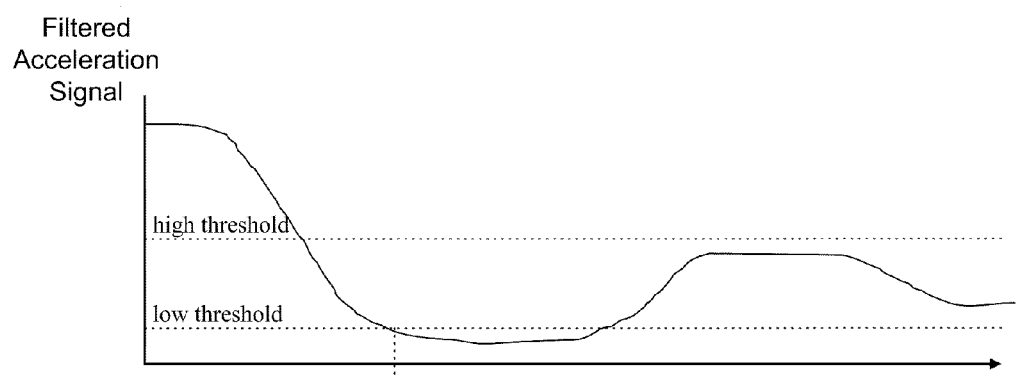
FIG. 9C is a graph illustrating using hysteresis in the filtered acceleration signal to switch the antennas less frequently, according to one embodiment.
Figure 9D:
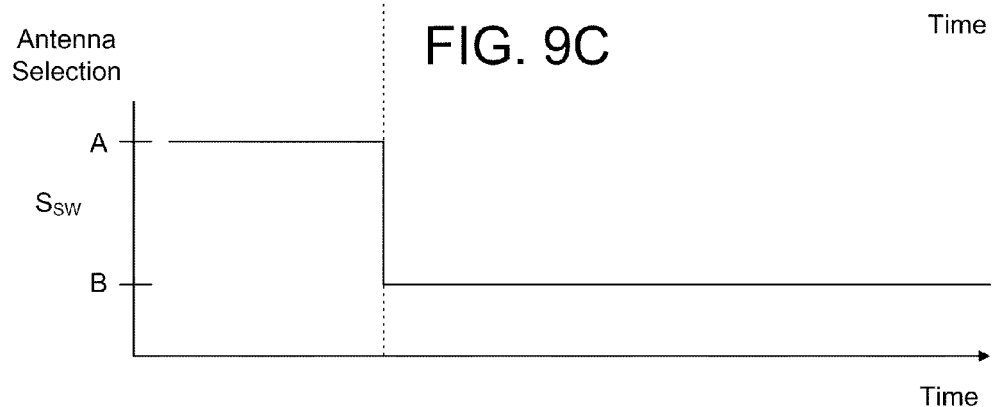
FIG. 9D is a graph illustrating selection of the antenna based on the filtered acceleration signal of FIG. 9C, according to one embodiment.

In one embodiment, hysteresis is introduced in switching of the antennas 56A, 56B. If the antennas for receiving the GPS signals are switched frequently, the GPS receiver module may lose track of the GPS signals from the satellites and fail to track its current location. By introducing the hysteresis in the switching of the antennas 56A, 56B, frequent switching of the antennas 56A, 56B is suppressed. FIGS. 9C and 9D are graphs illustrating selection of the antenna 56A, 56B based on the filtered acceleration signal. In the example of FIGS. 9C and 9D, two different levels of thresholds (high threshold and low threshold) serves as switching points of the switching signal $S_{SW}$.

When the filtered acceleration signal is high and the antenna 56A is originally selected as illustrated in FIG. 9D, the switching to the antenna 56B does not occur until the filtered acceleration signal drops below the low threshold. Note that the switching to the antenna 56B does not occur when the filtered acceleration signal drops below the high threshold set at a level higher than the low threshold. After switching to the antenna 56B, however, the switch 84 does not switch to the antenna 56A until the filtered acceleration signal rises above the high threshold. Note that the switching to the antenna 56A does not occur when the filtered acceleration signal rises above the low threshold. That is, the switching point (e.g., the low threshold) at which the selected antenna switches from a first antenna (e.g., the antenna 56A) to a second antenna (e.g., the antenna 56B) is lower than the switching point (e.g., the high threshold) at which the selected antenna switches from the second antenna (e.g., the antenna 56B) to the first antenna (e.g., the antenna 56A). Similarly, the switching point (e.g., the high threshold) at which the selected antenna switches from the second antenna (e.g., the antenna 56B) to the first antenna (e.g., the antenna 56A) is higher than the switching point (e.g., the low threshold) at which the selected antenna switches from the first antenna (e.g., the antenna 56A) to the second antenna (e.g., the antenna 56B).

By differentiating the switching point to and from one antenna to the other antenna, hysteresis is introduced in the switching of the antennas 56A, 56B. In this way, the switching between the antennas 56A, 56B occurs less frequently. The less frequent switching allows the GPS receiver module to track its location more stably.

Figure 10:
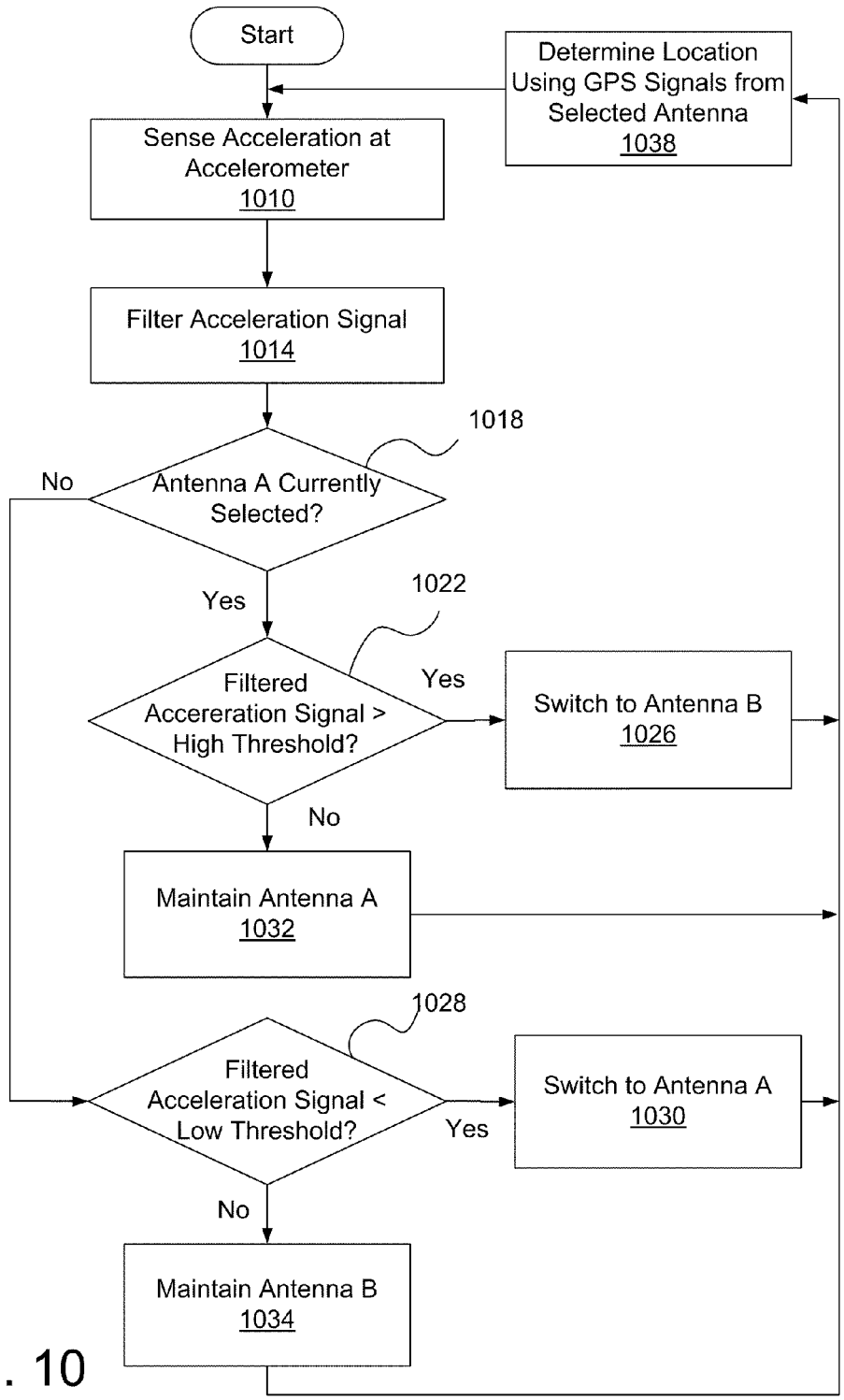
FIG. 10 is a flowchart illustrating a method of switching the antennas, according to one embodiment.

FIG. 10 is a flowchart illustrating a method of switching the antennas 56A, 56B, according to one embodiment. First, the acceleration (i.e., the direction of gravity relative to the orientation of the GPS receiver module) is sensed 1010 at the accelerometer 86 to generate the acceleration signal. The acceleration signal is then filtered 1014 by the signal processing module 88 to remove high frequency components of the acceleration signal. Then it is determined 1018 whether the currently selected GPS antenna is the antenna 56A or the antenna 56B. If the currently selected antenna is the antenna 56A, the process proceeds to determining 1022 whether the filtered acceleration signal is above the high threshold.

If the filtered acceleration signal is above the high threshold, the antenna for receiving the GPS signals is switched 1026 to the antenna 56B. Then the process proceeds to determine 1038 the location of the GPS receiver module using the GPS signals from the antenna 56B. If the filtered acceleration signal 1022 is not above the threshold at step 1022, the selected antenna (i.e., the antenna 56A) remains unchanged. Then the process proceeds to determine 1038 the location of the GPS receiver module using the GPS signals from the antenna 56A.

If the antenna currently selected is the antenna 56B (as determined at step 1018), it is determined 1028 whether the filtered acceleration signal is below the low threshold. If the filtered acceleration signal is below the low threshold, the process proceeds to switch 1030 the selected antenna to the antenna 56A. Then the process proceeds to determine 1038 the location of the GPS receiver module based on the GPS signals received from the antenna 56A. On the other hand, if it is determined (step 1028) that the filtered acceleration signal is not below the low threshold, the selected antenna (the antenna 56B) remains unchanged. Then the process proceeds to determine 1038 the location of the GPS receiver module based on the GPS signals received at the antenna 56B.

After determining 1038 the location of the GPS receiver module, the process returns to sensing 1010 the acceleration and generating the acceleration signal at the accelerometer 86.

Although the method of switching between antennas was described using two antennas, alternative embodiments may include three or more antennas. In one embodiment, two or more accelerometers are employed to determine vertical acceleration and horizontal acceleration. In another embodiment, two or more accelerometers are placed in planes that are orthogonal to each other.

Cluster of GPS Receiver Modules

In alternative embodiments, multiple GPS receiver modules may be deployed for tracking and determining the location of the GPS receiver modules. The multiple GPS receiver modules may be located in close proximity so that wireless communication between the GPS receiver modules may be established. If the quality of the GPS signals received at the GPS receiver module is not above a threshold, the GPS receiver module receives location information from other GPS receiver modules. The location indicated in the location information may then be taken as the GPS receiver module receiving the location information or further processing may be performed on the location information to more accurately determine the location of the GPS receiver module receiving the location information.

Figure 11:
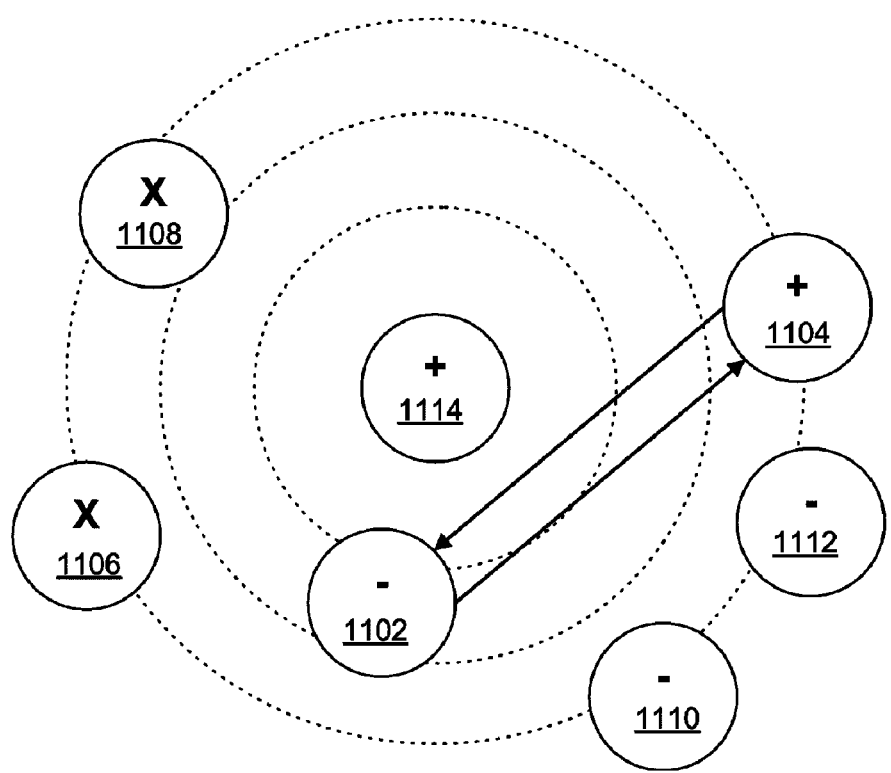
FIG. 11 is a diagram illustrating a cluster of GPS receiver modules communicating with each other, according to one embodiment.

FIG. 11 is a diagram illustrating a cluster of GPS receiver modules 1102-1112 deployed in an area. Each GPS receiver modules 1102-1112 may be placed in different locations and/ or conditions which causes the reception of the GPS signals to differ among the GPS receiver modules 1102-1112. In the example of FIG. 11, three GPS modules (GPS modules 1102, 1110, 1112) have poor reception of the GPS signals (represented by "−" mark), two GPS modules (GPS modules 1104, 1114) have good reception of the GPS signals (represented by "+" mark), and the remaining GPS modules (GPS modules 1106, 1108) may have no reception of the GPS signals (represented by "X" mark).

The GPS receiver modules sending the location information is referred to as a "provider GPS receiver module." The counterpart GPS receiver module receiving the location information is referred to as a "client GPS receiver module." In FIG. 11, the GPS module 1102 is illustrated as a client GPS receiver module, and the GPS module 1104 is illustrated as a provider GPS receiver module.

The provider GPS receiver module sends the location information to the client receiver module upon the request from the client receiver module or after detecting a triggering event (e.g., passing of time).

After receiving the location information from the provider GPS receiver module, the client GPS receiver module may take the location indicated in the location information as its location. Alternatively, the client GPS receiver module may receive the location information from multiple provider GPS receiver modules, and perform triangulation or other conventional techniques to compute or verify its location.

In one embodiment, a quality indicator is generated and transmitted by the provider GPS receiver module. The quality indicator represents the quality of the GPS signal reception. The quality indicator may indicate, for example, the number of satellites from which the GPS signals were received. The client GPS receiver module may receive the location information and the quality indicators from multiple provider GPS receiver modules. The client GPS receiver module may use the location information obtained from the provider GPS receiver module with the highest quality indicator to determine the location of the client GPS receiver module.

In one embodiment, the client GPS receiver module determines its location based on the GPS signals received at the GPS receiver module when the quality of the GPS signals it received is above a predetermined threshold. If the quality of the received GPS signals is not above the predetermined threshold, the client GPS receiver module may request the provider GPS receiver to provide the location information and the quality indicator. The client GPS receiver module may compare the qualities of the GPS signals received at the client GPS receiver module and the provider GPS receiver module using the quality indicator received from the provider GPS receiver module.

In one embodiment, after comparing the qualities of the received GPS signals, the client GPS receiver module computes its location using the GPS signals received at the client GPS receiver module if the quality of the GPS signals received at the client GPS receiver module is better than the quality of the GPS signals received at the provider GPS receiver module. In contrast, the client GPS receiver module uses the location information from the provider GPS receiver modules if the quality of the GPS signals received at the provider GPS receiver module is better than the GPS signals received at the client GPS receiver module.

Figure 12:
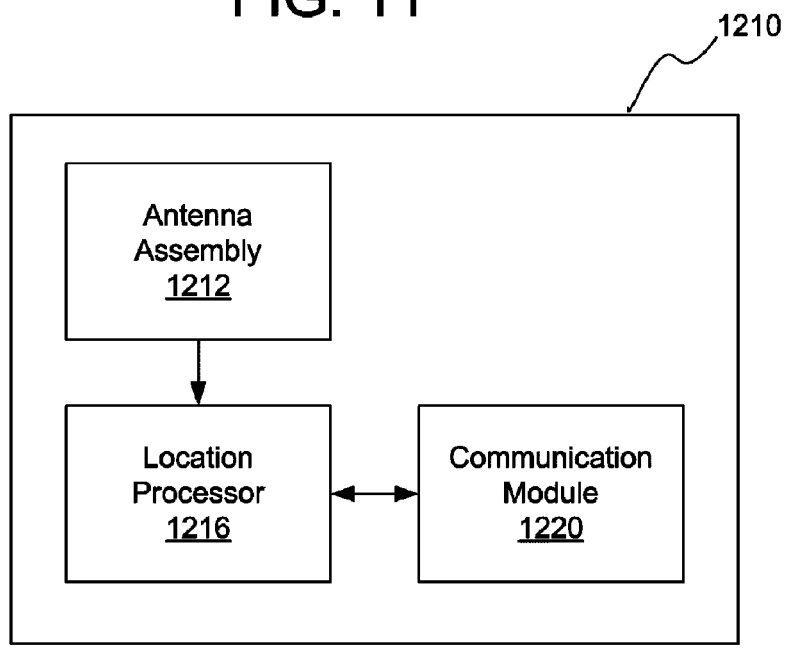
FIG. 12 is a block diagram illustrating the GPS receiver module of FIG. 11, according to one embodiment.

FIG. 12 is a block diagram illustrating the GPS receiver module 1210 of FIG. 11, according to one embodiment. The GPS receiver module 1210 includes, among other components, an antenna assembly 1212, a location processor 1216, and a communication module 1220. The antenna assembly 1212 is coupled to the location processor 1216. The communication module 1220 is coupled to the location processor 1216.

The antenna assembly 1212 receives the GPS signals from the GPS satellites and feeds the GPS signals to the location processor 1216. Any one of the antenna assembly 1212 as described above with reference to FIGS. 3, 5, 6, and 8 or other conventional antenna assembly may be used as the antenna assembly 1212.

The communication module 1220 is a short-range wireless communication module (e.g., IEEE 802.15.4, Bluetooth, Wireless Fidelity (WiFi) component) capable of sending or receiving the location information and/or the quality indicator. In one embodiment, the communication module 1220 employs IEEE 802.15.4 physical standard. For example, the communication module 1220 may be implemented by Chipcon CC2420 radio component from Texas Instrument (Dallas, Tex.) or Atmel RF 230 radio component from Atmel Corporation (San Jose, Calif.) to communicate using the IEEE 802.15.4 physical standard in the 2.4 GHz ISM band. These components are merely illustrative, and various other components may also be used. When the GPS receiver module 1210 is functioning as a provider GPS receiver module, the communication module 1220 receives the location information and the quality indicator from the location processor 1216 and transmits the location information and the quality indicator to a client GPS receiver module wireless communication. In contrast, when the GPS receiver module 1210 is functioning as a client GPS receiver module, the communication module 1220 receives wireless message including the location information and the quality indicator from the provider GPS module and relays the message to the location processor 1216.

The location processor 1216 determines the location of the GPS receiver module 1210 based on either the GPS signals received via the antenna assembly 1212 or the location information received via the communication module 1220. The location processor 1216 includes, among other components, an RF modulator and a GPS processor (not shown). The RF modulator modulates the GPS signal received via the antenna assembly 1212 into modulated GPS signals for processing by the GPS processor. The GPS processor decodes and processes the GPS signals to compute the location of the GPS receiver module 1210.

In one embodiment, the location processor 1216 extracts the quality indicator from the message received from the provider GPS receiver module and compares the quality of signal reception at the provider GPS receiver module with the quality of GPS signals received via its antenna assembly 1212. The location processor 1216 determines the location of the GPS receiver module 1210 based on the GPS signals received via the antenna assembly 1212 if the quality of signal received via the antenna assembly 1212 is better than the quality of the GPS signals received at the provider GPS receiver module. On the other hand, if the quality of the GPS signals received at the provider GPS receiver module is better than what is received via the antenna assembly 1212, the location processor 1216 takes the location as indicated by the location information as its location or performs processing based on the received location information.

By communicating with other GPS receiver modules to determine the location, the location of the GPS receiver module can be accurately determined even if the reception of the GPS signals is not good or available at the GPS receiver module. Also, the location determination may become more robust because the location may be tracked even when the components for tracking the GPS signals fail or malfunction.

Figure 13:
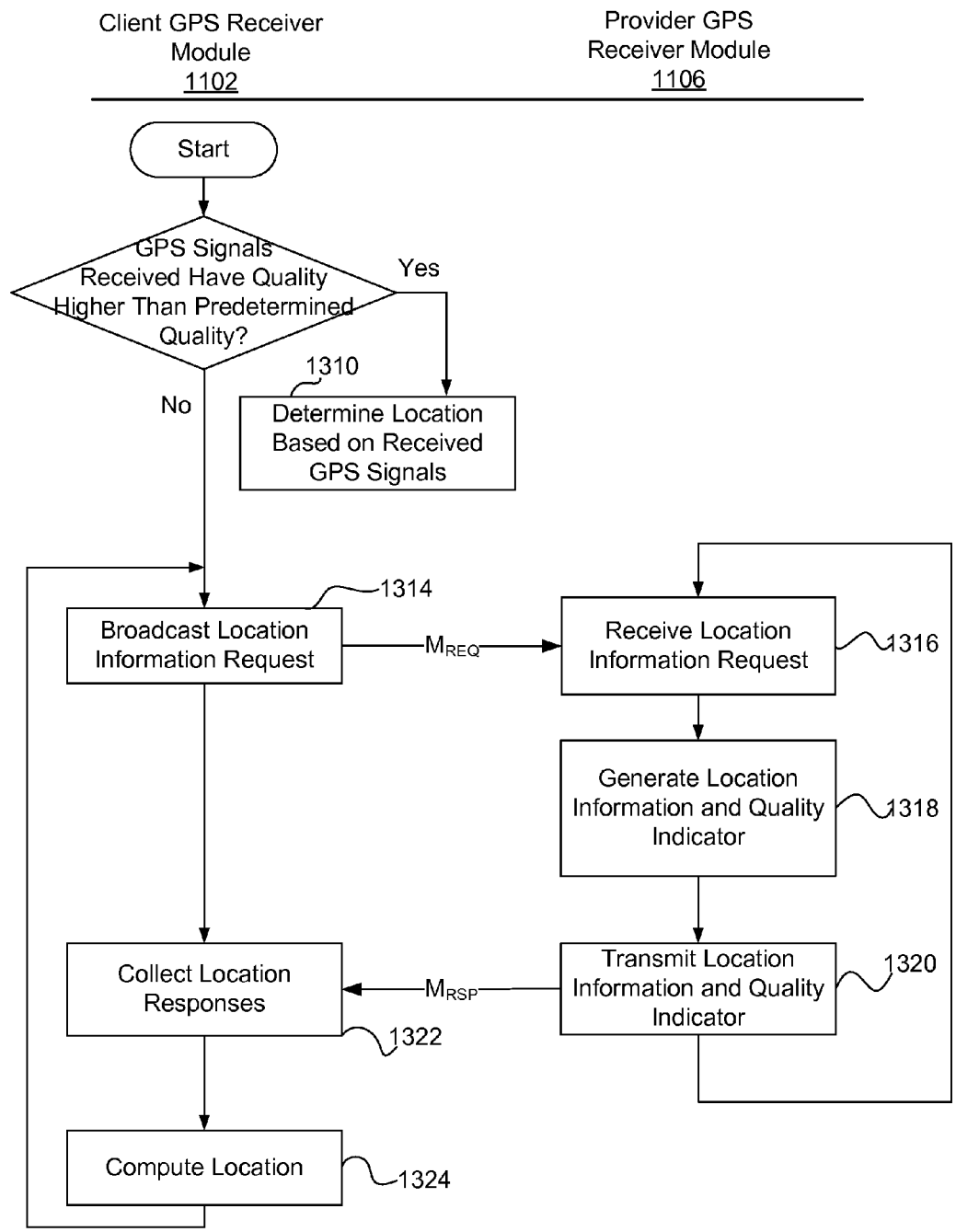
FIG. 13 is an interaction diagram illustrating a method of sending location information from a provider GPS receiver module to a client GPS receiver module as initiated by the client GPS receiver module, according to one embodiment.

The communication of the location information and/or the quality indicator may be initiated either by a client GPS receiver module or a provider GPS receiver module. FIG. 13 is an interaction diagram for one embodiment in which the communication is initiated by the client GPS receiver module 1102. First, the client GPS receiver module 1102 determines if the GPS signals received at its antenna assembly have quality higher than a predetermined quality. If the quality is above the predetermined quality, the client GPS receiver module 1102 determines 1310 its location based on the GPS signal received at its antenna assembly. If the quality is not above the predetermined threshold, the client GPS receiver module 1102 broadcasts 1314 a request message $M_{REQ}$ to other GPS receiver modules 1106 for the location information The provider GPS receiver module 1106 receives 1316 the request $M_{REQ}$, and then generates 1318 the location information and the quality indicator based on the GPS signals received at the provider GPS receiver module 1106. The provider GPS receiver module 1106 then transmits 1320 the location information and the quality indicator to the client GPS receiver module in a response message $M_{RSP}$. The client GPS receiver module 1102 collects 1322 the response message $M_{RSP}$ from the provider GPS receiver module 1102, and then computes its location 1324 by taking the location indicated in the location information as the location of the client GPS receiver module 1102 or performing further processing (e.g., triangulation) to determine more accurate location of the client GPS receiver module 1102.

In one embodiment, the client GPS receiver module 1102 compares the quality of the receive GPS signals at the client GPS receiver module 1102 and the provider GPS receiver module 1106. The client GPS receiver module 1102 computes its location based on the location information when the GPS signal received at the provider GPS receiver module 1106 has better quality compared to the GPS signals received at the client GPS receiver module 1102. But the client GPS receiver module 1102 computes its location based on the GPS signals received at its antenna assembly 1212 when the quality of the GPS signals received at its antenna assembly 1212 is better than the quality of the GPS signals received at the provider GPS receiver module 1106.

Figure 14:
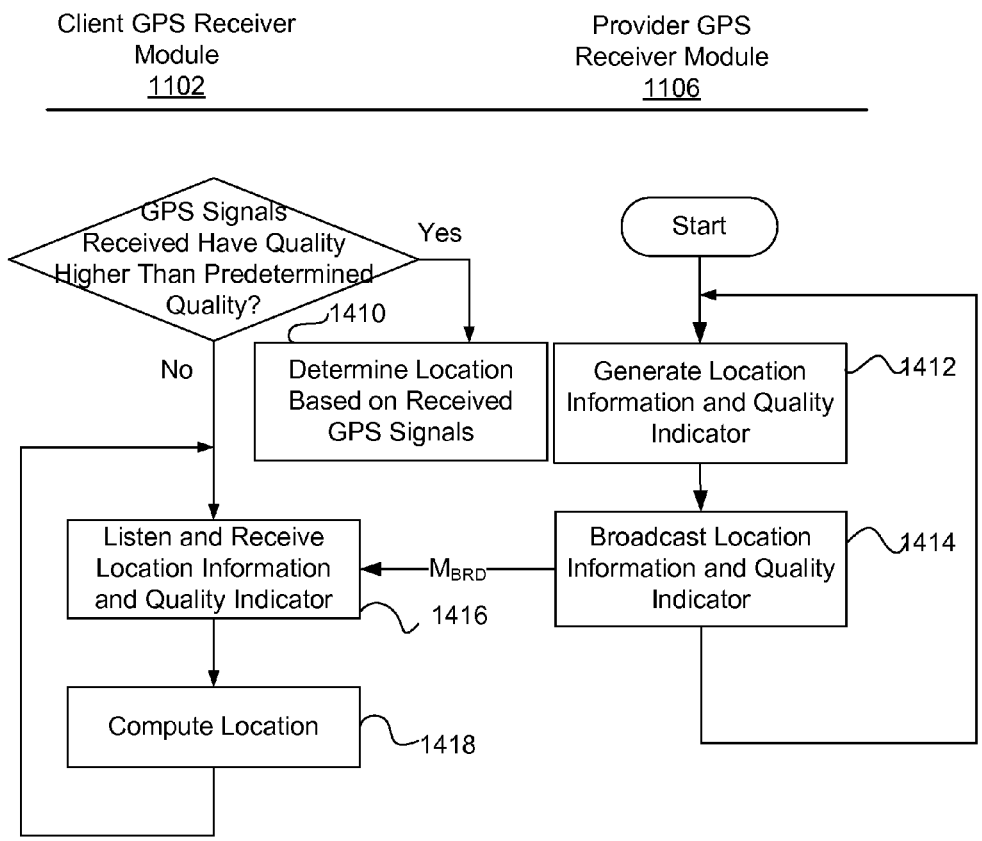
FIG. 14 is an interaction diagram illustrating a method of sending location information from a provider GPS receiver module to a client GPS receiver module as initiated by the provider GPS receiver module, according to one embodiment.

FIG. 14 is an interactive diagram illustrating a method in which the provider GPS receiver module 1106 periodically broadcasts the location information regardless of requests from other GPS receiver modules. In this embodiment, the client GPS receiver module 1102 determines if GPS signals received at its antenna assembly have a quality higher than a predetermined quality. If the received GPS signals have a quality higher than the predetermined quality, then the location of the client GPS receiver module 1102 is determined 1410 based on the received GPS signals. The provider GPS receiver module 1106 generates 1412 the location information and the quality indicator. Then the provider GPS receiver module 1106 broadcasts the location information and the quality information in a broadcast message $M_{BRD}$. If the client PGS receiver module 1102 determines that the quality of the received GPS signals is not higher than a predetermined quality, the client GPS receiver module 1102 listens to and receives 1416 the broadcast message $M_{BRD}$ transmitted by the provider GPS receiver module 1106. Then the client GPS receiver module 1102 computes 1418 the location of the client GPS receiver module 1102 based on the location information received from the provider GPS receiver module 1106.

As in the embodiment of FIG. 10, the client GPS receiver module 1102 may use the location information when the GPS signal received at the provider GPS receiver module 1106 is of better quality than the GPS signals received at the client GPS receiver module 1102 but not when the GPS signal received at its antenna assembly 1212 is of better quality than the GPS signals received at the provider GPS receiver module 1106.

In one embodiment, the GPS receiver module 1102 may perform other functions in addition to determining and tracking of its locations. For example, the GPS receiver module 1102 may monitor the temperature or humidity of the surrounding environment.

While particular embodiments and applications have been illustrated and described, it is to be understood that the present invention is not limited to the precise construction and components disclosed herein and that various modifications, changes and variations may be made in the arrangement, operation and details of the method and apparatus of the present invention disclosed herein without departing from the spirit and scope of the invention as defined in the appended claims.

What is claimed is:

1. A method of determining a location of a first global positioning system (GPS) receiver module, comprising;
   determining the location of the first GPS receiver module by processing first GPS signals received at the first GPS receiver module without receiving location information from a second GPS receiver module responsive to receiving the first GPS signals having quality higher than a predetermined quality; and
   responsive to the first GPS signals having quality not higher than the predetermined quality:
      receiving location information from the second GPS receiver module, the location information indicating the location of the second GPS receiver module and generated by the second GPS receiver module based on second GPS signals received at the second GPS receiver module,
      comparing the quality of the first GPS signals and the quality of the second GPS signal, and
      determining the location of the first GPS receiver module as the location indicated by the location information responsive to the second GPS signals having a higher quality than the first GPS signals.

2. The method of claim 1, further comprising:
   determining the location of the first GPS receiver module by processing the first GPS signals responsive to the quality of the second GPS signals not being higher than the quality of the first GPS signals.

3. The method of claim 2, further comprising the first GPS receiver module receiving the location information from the second GPS receiver module responsive to transmitting a message to the second GPS receiver module requesting the location information.

4. The method of claim 2, further comprising the first GPS receiver module receiving the location information periodically transmitted by the second module.

5. A global positioning system (GPS) receiver module comprising:
   a GPS antenna for receiving first GPS signals;
   a communication module for communicating with another GPS receiver module, the other GPS receiver module configured to generate location information indicating the location of the second GPS receiver module; and
   a location processor coupled to the GPS antenna and the communication module, the location processor configured to:
      determine a location of the GPS receiver module by processing first GPS signals received at the first GPS receiver module without receiving the location information from the other GPS receiver module responsive to receiving the first GPS signals having quality higher than a predetermined quality, responsive to the first GPS signals having quality not higher than the predetermined quality:
- receive the location information from the other GPS receiver module,
- compare the quality of the first GPS signals and the quality of the second GPS signal, and
- determine the location of the GPS receiver module as the location indicated by the location information responsive to the second GPS signals having higher quality than the first GPS signals.

6. The GPS receiver module of claim 5, wherein the location processor is further configured to:

determining the location of the GPS receiver module by processing the first GPS signals responsive to the quality of the second GPS signals not being higher than the quality of the first GPS signals.

7. The GPS receiver module of claim 6, wherein the GPS receiver module receives the location information and the quality indicator from the other module responsive to transmitting a message to the other module requesting the location information and the quality indicator.

8. The GPS receiver module of claim 6, wherein the GPS receiver module receives the location information and the quality indicator periodically transmitted by the other GPS receiver module.

* * * * *